United States Patent
Li

(10) Patent No.: US 8,642,990 B2
(45) Date of Patent: Feb. 4, 2014

(54) DIAMOND TYPE QUAD-RESISTOR CELLS OF PRAM

(71) Applicant: Qualcomm Incorporated, San Diego, CA (US)

(72) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/762,424

(22) Filed: Feb. 8, 2013

(65) Prior Publication Data

US 2013/0153854 A1  Jun. 20, 2013

Related U.S. Application Data

(62) Division of application No. 13/471,805, filed on May 15, 2012, and a division of application No. 12/421,044, filed on Apr. 9, 2009, now Pat. No. 8,193,522.

(51) Int. Cl.
*H01L 29/06* (2006.01)

(52) U.S. Cl.
USPC .............. 257/5; 257/2; 257/4; 257/E47.001; 438/382

(58) Field of Classification Search
None
See application file for complete search history.

(56) References Cited

U.S. PATENT DOCUMENTS

| | | |
|---|---|---|
| 8,193,522 B2 | 6/2012 | Li |
| 2003/0189200 A1 | 10/2003 | Lee et al. |
| 2005/0242338 A1 | 11/2005 | Hart et al. |
| 2005/0242388 A1 | 11/2005 | Willer et al. |
| 2006/0091374 A1 | 5/2006 | Yoon et al. |
| 2006/0097239 A1 | 5/2006 | Hsiung |
| 2007/0012956 A1 | 1/2007 | Gutsche et al. |
| 2007/0069249 A1 | 3/2007 | Hayakawa |
| 2007/0165452 A1 | 7/2007 | Hayakawa |
| 2008/0042118 A1 | 2/2008 | Hayakawa |
| 2009/0008621 A1 | 1/2009 | Lin et al. |
| 2009/0184306 A1 | 7/2009 | Mathew et al. |
| 2010/0012916 A1 | 1/2010 | Kuo et al. |
| 2012/0223287 A1 | 9/2012 | Li |

FOREIGN PATENT DOCUMENTS

| | | |
|---|---|---|
| CN | 101164176 A | 4/2008 |
| EP | 1355365 | 10/2003 |
| JP | 2007080978 A | 3/2007 |
| KR | 20060039996 A | 5/2006 |
| KR | 20060079563 A | 7/2006 |
| WO | 2006059313 | 8/2006 |
| WO | 2006079952 | 8/2006 |
| WO | 2007071922 | 6/2007 |

OTHER PUBLICATIONS

International Search Report—PCT/US2010/030510—International Search Authority, European Patent Office, Oct. 7, 2010.
Written Opinion—PCT/US2010/030510—International Search Authority European Patent Office—Oct. 7, 2010.

*Primary Examiner* — Tucker Wright
(74) *Attorney, Agent, or Firm* — Michelle Gallardo

(57) ABSTRACT

A method of forming a phase-change random access memory (PRAM) cell, and a structure of a phase-change random access memory (PRAM) cell are disclosed. The PRAM cell includes a bottom electrode, a heater resistor coupled to the bottom electrode, a phase change material (PCM) formed over and coupled to the heater resistor, and a top electrode coupled to the phase change material. The phase change material contacts a portion of a vertical surface of the heater resistor and a portion of a horizontal surface of the heater resistor to form an active region between the heater resistor and the phase change material.

7 Claims, 16 Drawing Sheets

DIAMOND TYPE QUAD-RESISTOR CELLS OF PRAM

CLAIM OF PRIORITY UNDER 35 U.S.C. §120

The present Application for Patent is a Divisional of patent application Ser. No. 13/471,805 entitled "DIAMOND TYPE QUAD-RESISTOR CELLS OF PRAM" filed May 15, 2012, pending, which is a Divisional of patent application Ser. No. 12/421,044 entitled "DIAMOND TYPE QUAD-RESISTOR CELLS OF PRAM" filed Apr. 9, 2009, now U.S. Pat. No. 8,193,522, issued Jun. 5, 2012, and assigned to the assignee hereof and hereby expressly incorporated by reference herein in its entirety.

FIELD

The disclosed embodiments are related to methods of forming a phase-change random access memory (PRAM) cell, and embodiments of phase-change random access memory (PRAM) cells. More particularly, the disclosed embodiments are related to methods of forming diamond-type quad-resistor cells of phase-change random access memory (PRAM), and embodiments of diamond-type quad-resistor cells of phase-change random access memory (PRAM).

BACKGROUND

Phase-change memory (PCM) is an emerging memory having non-volatile features and bit access capability. Phase-change memory (PCM) beneficially provides fast read/write speeds, is durable, retains data well, and is scalable. PCM can provide random bit access capability. Therefore, PCM may be referred to as phase-change random access memory (PRAM).

A conventional PRAM cell will now be described with reference to FIG. 1. A PRAM cell typically includes a transistor 112 and a PRAM resistor 110. The emitter of the PRAM resistor 110 is connected in series to bit line 114, the transistor 112 is connected to word line 116, and the collector of the transistor 112 is connected to Vss 120. The PRAM resistor 110 is used as the storage element 118 of the PRAM cell.

FIG. 2 shows a conventional PRAM resistor 110 that can be used as the storage element 118 of the conventional PRAM cell of FIG. 1. A conventional PRAM resistor 110 commonly includes a phase change material (PCM) 232, a heater resistor 234, a top electrode 230, and a bottom electrode 236. An active area 238 is defined by the interface between the PCM 232 and the heater resistor 234.

The PRAM cell uses the characteristic behavior of chalcogenide glass, which can be "switched" between two states, i.e., crystalline and amorphous, by the application of heat. The phase change material (PCM) 232 of the PRAM resistor 110 commonly is formed from a phase change compound of group VI chalcogenic elements S, Se, Te with group IV and V elements. For example, conventional PRAM typically uses a chalcogenide alloy of germanium, antimony and tellurium (GeSbTe) called GST.

The phase of the chalcogenic alloy can be changed by applying different temperatures. For example, the chalcogenide alloy can be heated to a high temperature (over 600° C.), at which point the chalcogenide becomes a liquid. Once cooled, the chalcogenide alloy is frozen into an amorphic glass-like state in which the electrical resistance of the chalcogenide alloy is high. By heating the chalcogenide alloy to a temperature above its crystallization point, but below the melting point, the chalcogenide alloy can be transformed into a crystalline state with a much lower resistance. This phase transition process can be completed in as quickly as five nanoseconds.

For example, as shown in FIG. 3A, the phase of chalcogenic alloy can be set or changed by applying different temperature, such as $T_m$ and $T_x$, for a predetermined period of time. For example, if the PCM 232 is in the amorphous phase, a lower temperature $T_x$ can be applied to the PCM 232 for a longer period of time to set or change the phase of the PCM 232 to the crystalline phase. If the PCM 232 is in the crystalline phase, a higher temperature, e.g., above its melting point temperature $T_m$, can be applied to the PCM 232 for a short time to reset or change the PCM 232 to the amorphous phase.

As explained above, the amorphous phase typically has a high resistivity and the crystalline phase typically has a low resistivity. The PRAM cell uses the resistivity difference between the amorphous phase and the poly-crystal phase of chalcogenic alloy to provide a storing mechanism. For example, the amorphic, high resistance state can be defined to represent a binary "0", and the crystalline, low resistance state can be defined to represent a "1".

For illustrative purposes, FIG. 3B shows a pair of conventional PRAM cells. The first PRAM cell includes a top electrode 340, a phase change material (PCM) 342, a heater resistor 344, and a bottom electrode 346. A word line 348 is used to select the first PRAM cell. The second PRAM cell includes a top electrode 350, a phase change material (PCM) 352, a heater resistor 354, and a bottom electrode 356. A word line 358 is used to select the second PRAM cell. The first and second PRAM cells can share a common bit line 360.

As exemplarily shown in FIG. 3B, the first cell can be set to the crystalline, low resistance state to represent, for example, a binary "1". The second cell can be set to the amorphic, high resistance state to represent, for example, a binary "0". The application of heat by the heater resistor 354 to the PCM 352 sets or changes the phase change material to the amorphic, high resistance state in the active area 362.

With reference again to FIGS. 1-3B, the writing mechanism for the PRAM cell is provided by the self-heating resulting from the current flow (Joule effect) through the phase change material interface (e.g., the active area between the heater resistor and the PCM) of the PRAM resistor 110. The reading mechanism for the PRAM cell is provided by the resistance difference of PRAM resistor 110.

In conventional PRAM cells, the minimum size of the contact window between the phase change material (PCM) and the heater resistor film is limited by conventional design rules. That is, the minimum horizontal contact size of the heater resistor film with the PCM is limited or constrained by the conventional design rule associated with the formation of the heater resistor film (e.g., half pitch lithography resolution). Therefore, since the ability to reduce the size of the active area between the PCM and the heater resistor is limited, the minimum writing current needed to program the conventional PRAM cell is limited. That is, the set current and the reset current of the conventional PRAM cell cannot be reduced beyond a minimum amount based on the size of the contact area between the heater resistor and the PCM. Conventional PRAM cells use a bipolar junction transistor (BJT) device to meet the writing current requirements and to reduce cell size.

SUMMARY

The disclosed embodiments are directed to methods of forming a phase-change random access memory (PRAM) cell, and embodiments of phase-change random access memory (PRAM) cells. More particularly, the disclosed embodiments are related to methods of forming diamond-type quad-resistor cells of phase-change random access memory (PRAM), and embodiments of diamond-type quad-resistor cells of phase-change random access memory (PRAM).

The disclosed embodiments can multiply or increase the number of bits and reduce the contact area beyond the conventional design rules to reduce resistance. The disclosed embodiments also can reduce current requirements for switching. The embodiments are applicable, for example, to a complementary metal oxide semiconductor (CMOS) device to drive phase change material (PCM) switching.

The disclosed embodiments recognize that the PRAM cell density can be limited, for example, by the size of the PRAM cell, the connection, and the pass gate transistor. The arrangement or layout of the PRAM cell can be improved, to reduce the size of the cell and increase the density of the cell. The embodiments provide, for example, a novel cross diamond type quad-resistor cell including a shared top electrode or bottom electrode that provide an advantage of reducing the size of the PRAM cell. For example, by sharing a heater resistor or a phase change material (PCM), the disclosed embodiments can reduce PRAM cell size.

The disclosed embodiments further recognize that the size of the contact window between the PCM film and the heater resistor is an important factor in reducing the set current and the reset current of the PRAM cell. For example, the embodiments recognize that reducing the size of the contact window between the PCM film and the heater resistor can provide an advantage of reducing the set current and the reset current of the PRAM cell.

An embodiment of a PRAM cell uses a corner of the heater resistor or PCM film to form a natural sub-trench overlap, or stepped portion, which forms a smaller contact window between the heater resistor and the PCM film. The embodiment can reduce the size of the PCM contact window beyond, for example, the half pitch of lithography resolution of the conventional technology generation. Accordingly, the size of the overall phase change resistor can be reduced and less current is needed, to program the PRAM cell. Furthermore, in contrast to the conventional PRAM cells, which use a bipolar junction transistor (BTJ) device to program the phase-change random access memory (PRAM) cell, the disclosed embodiments can provide a metal oxide semiconductor (MOS) device to program the phase-change random access memory (PRAM) cell without increasing the PRAM cell size.

For example, an embodiment is directed to a phase-change random access memory (PRAM) cell. The PRAM cell can comprise a bottom electrode, a heater resistor coupled to the bottom electrode, a phase change material (PCM) formed over and coupled to the heater resistor, and a top electrode coupled to the phase change material (PCM). The phase change material (PCM) contacts a portion of a vertical surface of the heater resistor and a portion of a horizontal surface of the heater resistor to form an active region between the heater resistor and the phase change material (PCM).

Another embodiment is directed to a phase-change random access memory (PRAM) arrangement, which includes a plurality of phase-change random access memory (PRAM) cells. Each of the PRAM cells can comprise a bottom electrode, a heater resistor coupled to the bottom electrode, a phase change material (PCM) formed over and coupled to the heater resistor, and a top electrode coupled to the phase change material (PCM). The phase change material (PCM) contacts a portion of a vertical surface of the heater resistor and a portion of a horizontal surface of the heater resistor to form an active region between the heater resistor and the phase change material (PCM).

Another embodiment is directed to a method of forming a phase-change random access memory (PRAM) cell. The method can comprise forming a bottom electrode, forming a via interconnect on the bottom electrode, forming a heater resistor over the via interconnect, and forming a phase change material (PCM) over an active region of the heater resistor. The active region of the heater resistor includes a portion of a vertical surface of the heater resistor and a portion of a horizontal surface of the heater resistor. The method further can comprise forming a top electrode over the phase change material (PCM).

Another embodiment is directed to a method of forming a phase-change random access memory (PRAM) cell arrangement. The method can comprise forming a plurality of bottom electrodes, forming a plurality of via interconnects, wherein each via interconnect is formed on one of the plurality of bottom electrodes, forming a plurality of heater resistors, wherein each of the plurality of heater resistors is formed on one of the plurality of via interconnects, forming a common phase change material (PCM) film over a portion of a vertical surface of each of the plurality of heater resistors and a portion of a horizontal surface of each of the plurality of heater resistors, and forming a common top electrode over the common phase change material (PCM).

Another embodiment is directed to a method of forming a phase-change random access memory (PRAM) cell arrangement. The method can comprise forming a common bottom electrode, forming a common via interconnect on the bottom electrode, forming a common heater resistor on the via interconnect, and forming a plurality of phase change material (PCM) films over the common heater resistor. Each of the plurality of phase change material (PCM) films contact a portion of a vertical surface of the heater resistor and a portion of a horizontal surface of the heater resistor. The method further can comprise forming a plurality of common top electrodes over the plurality of phase change material (PCM) films, wherein each of the plurality of common top electrodes contact one of the plurality of phase change material (PCM) films.

Another embodiment is directed to a method of forming a three-dimensional phase-change random access memory (PRAM) cell arrangement. The method can comprise forming a common bottom electrode, forming a common via interconnect on the bottom electrode, and forming a common heater resistor on the via interconnect. The heater resistor can comprise a plurality of first leg portions extending in a first plane and at least one second leg portion extending in a second plane. The method further can comprise forming a phase change material (PCM) film over an end of each of the plurality of first leg portions and the at least one second leg portion of the heater resistor to form active regions, and forming a top electrode over the phase change material (PCM) film.

Another embodiment is directed to phase-change random access memory (PRAM) cell, comprising a resistive means for generating heat, and a phase change means for allowing phase change coupled to the resistive means, wherein an active region between the resistive means and the phase change means is defined by a first physical dimension and a second physical dimension of the resistive means.

Yet another embodiment is directed to a method of forming a phase-change random access memory (PRAM) cell, the method comprising step for forming a heater resistor, and step for forming a phase change material (PCM) over an active region of the heater resistor, wherein the active region of the heater resistor includes a portion of a vertical surface of the heater resistor and a portion of a horizontal surface of the heater resistor.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Figure 1:
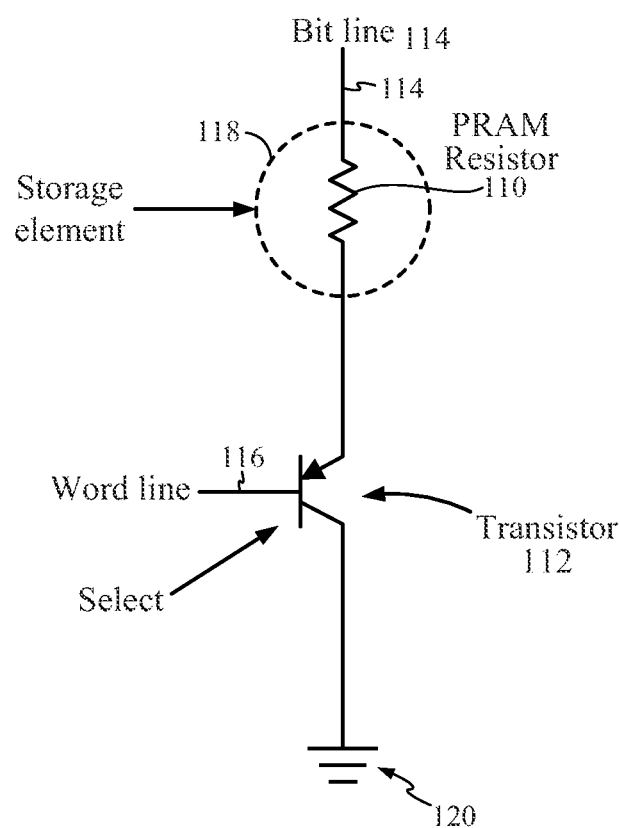
FIG. 1 is a schematic of a conventional PRAM cell.
Figure 2:
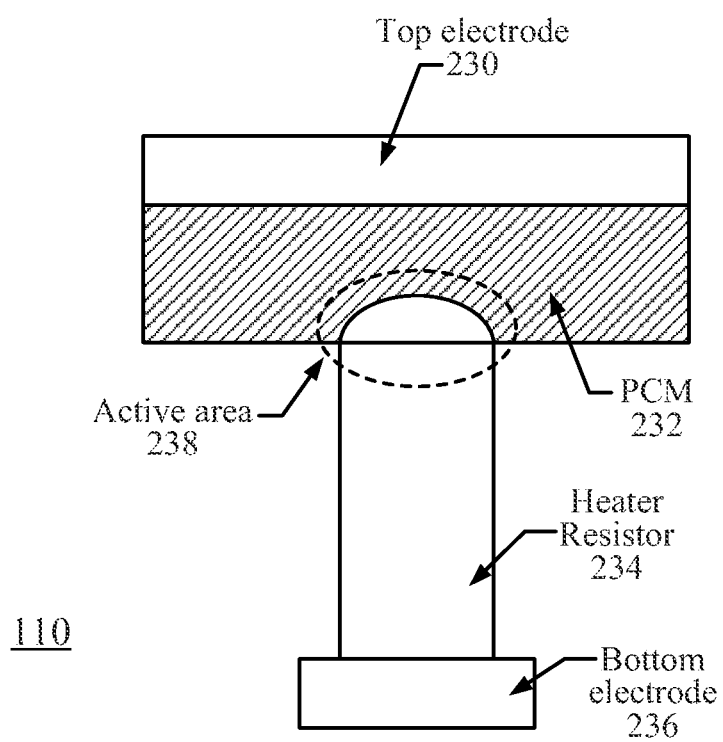
FIG. 2 is a cross-sectional view of a conventional PRAM resistor structure.
Figure 3A:
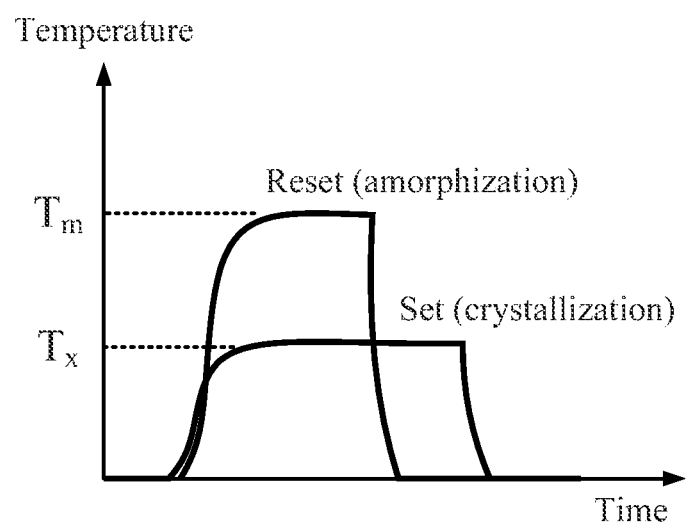
FIG. 3A is a graph showing exemplary temperature curves for phase change of a conventional PRAM resistor.
Figure 3B:
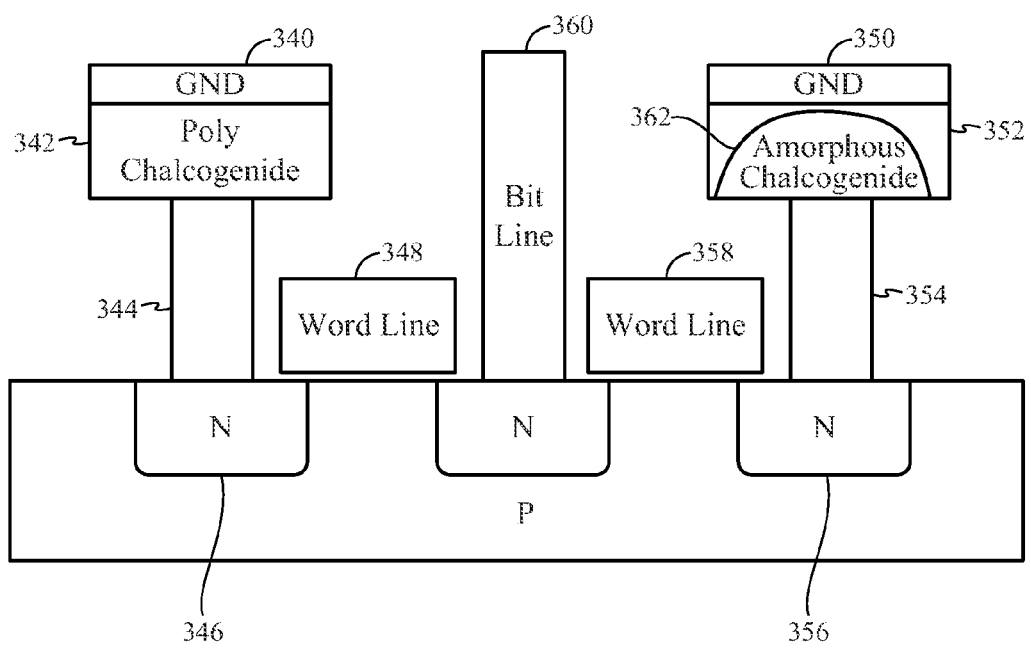
FIG. 3B is a cross-sectional view of a pair of conventional PRAM cells.

Aspects of the embodiments are disclosed in the following description and related drawings directed to such embodiments. Alternate embodiments may be devised without departing from the scope of the invention. Additionally, well-known elements used and applied in the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,". "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments are directed to methods of forming a phase-change random access memory (PRAM) cell, and embodiments of phase-change random access memory (PRAM) cells. More particularly, the disclosed embodiments are related to methods of forming diamond-type quad-resistor cells of phase-change random access memory (PRAM), and embodiments of diamond-type quad-resistor cells of phase-change random access memory (PRAM).

The disclosed embodiments can multiply or increase the number of bits and reduce the contact area beyond the conventional design rules to reduce resistance. The disclosed embodiments also can reduce current requirements for switching. The embodiments are applicable, for example, to a complementary metal oxide semiconductor (CMOS) device to drive phase change material (PCM) switching.

The disclosed embodiments recognize that the PRAM cell density can be limited, for example, by the size of the PRAM cell, the connection, and the pass gate transistor. The arrangement or layout of the PRAM cell can be improved to reduce the size of the cell and increase the density of the cell. The embodiments provide, for example, a novel cross diamond type quad-resistor cell including a shared top electrode or bottom electrode that provide an advantage of reducing the size of the PRAM cell. For example, by sharing a heater resistor or a phase change material (PCM), the disclosed embodiments can reduce PRAM cell size.

The disclosed embodiments further recognize that the size of the contact window between the PCM film and the heater resistor is an important factor in reducing the set current and the reset current of the PRAM cell. For example, the embodiments recognize that reducing the size of the contact window between the PCM film and the heater resistor can provide an advantage of reducing the set current and the reset current of the PRAM cell.

An embodiment of a PRAM cell uses a corner of the heater resistor or PCM film to form a natural sub-trench overlap, or stepped portion, which forms a smaller contact window between the heater resistor and the PCM film. The embodiment can reduce the size of the PCM contact window beyond, for example, the half pitch of lithography resolution of the conventional technology generation. Accordingly, the size of the overall phase change resistor can be reduced and less current is needed to program the PRAM cell. Furthermore, in contrast to the conventional PRAM cells, which use a bipolar junction transistor (BTJ) device to program the phase-change random access memory (PRAM) cell, the disclosed embodiments can provide a metal oxide semiconductor (MOS) device to program the phase-change random access memory (PRAM) cell without increasing the PRAM cell size.

Exemplary embodiments will now be described with reference to FIGS. 4-12.

An aspect of providing high density phase-change random access memory (PRAM) integration is reducing the active area to reduce the writing current. Because of limitations associated with the photo/etch process window, the size of the phase change material (PCM) contact area generally is limited by design rule. The disclosed embodiments overcome the technology photo/etch limitations of the conventional devices and methods.

Figure 4:
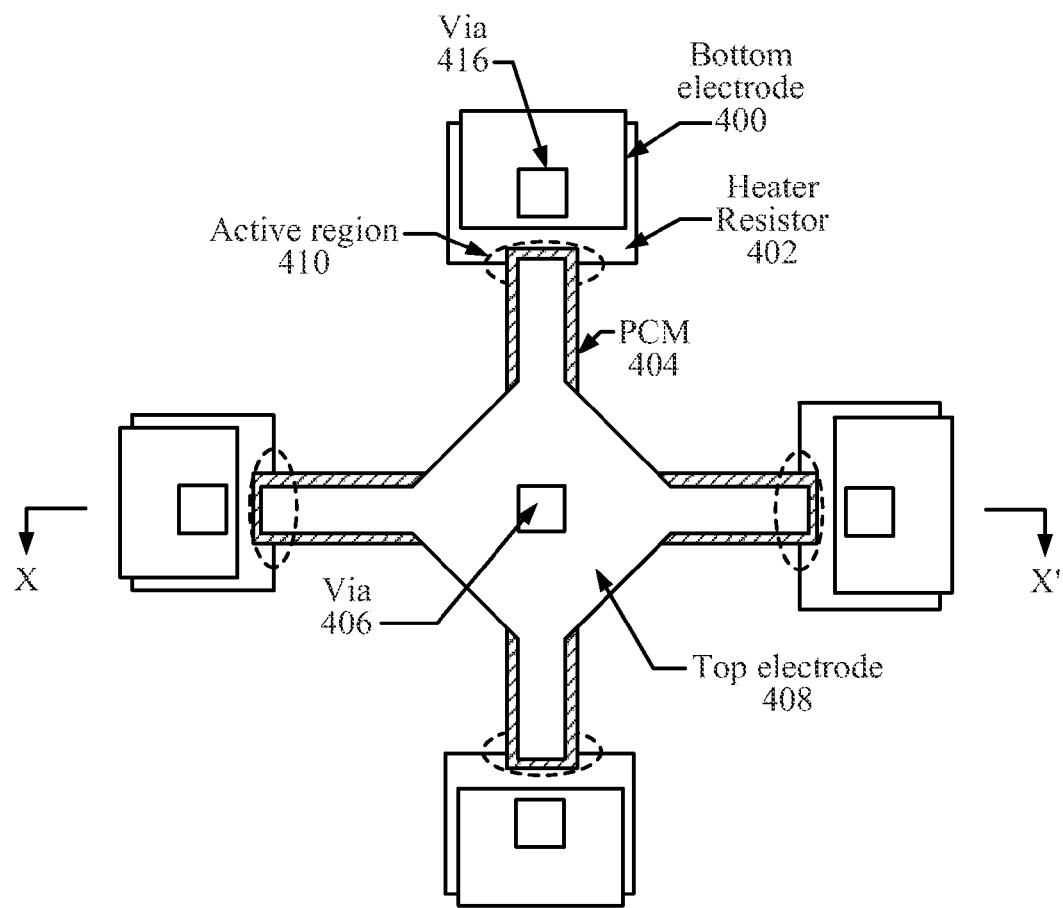
FIG. 4 is a top view of a PRAM quad-cell.
Figure 5:
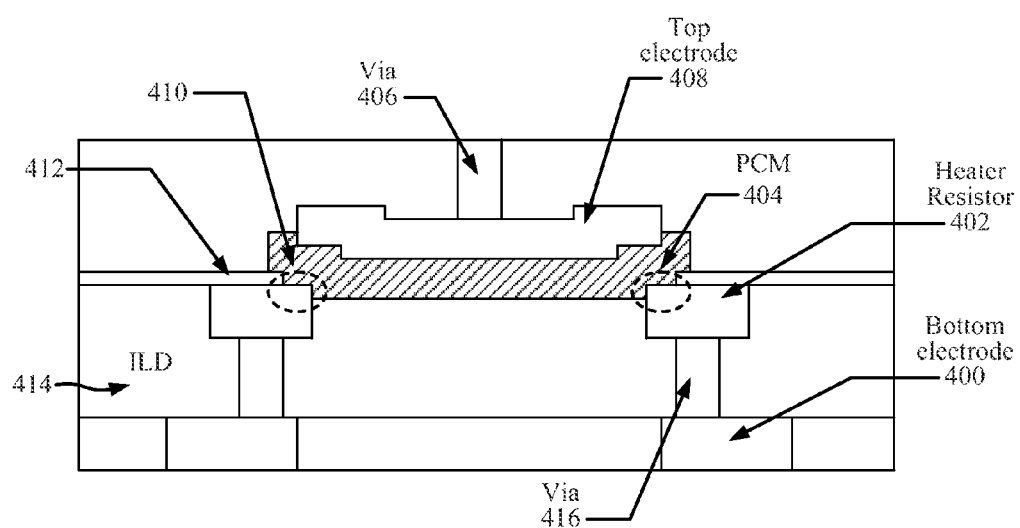
FIG. 5 is a cross-sectional view of the PRAM quad-cell illustrated in FIG. 4.

With reference to FIGS. 4 and 5, an exemplary embodiment of a novel diamond type quad-resistor cell of PRAM for providing high density PRAM integration will now be described.

As shown in FIGS. 4 and 5, each PRAM cell of the quad-resistor cell of PRAM includes a bottom electrode 400 (e.g., a separate or individual bottom electrode) that is coupled to a heater resistor 402 by a via interconnect 416. In an embodiment, the heater resistor 402 can be formed using a metal having a high resistivity to generate a Joule effect while the writing occurs. One of ordinary skill in the art will recognize that the corner of the heater resistor 402 can be formed from other materials by known processes. Other materials are contemplated by the present invention. The material of the PCM 404 is not limited to a compound of group VI chalcogenic elements S, Se, Te with group IV and V elements.

As shown in FIGS. 4 and 5, a cap film 412 is formed over each heater resistor 402. The PRAM quad resistor cell includes four individual PRAM cells, including four individual bottom electrodes 400, via interconnects 416, and heater resistors 402.

Next, the quad-cell structure includes a phase change material (PCM) 404 that is shared by each of the four PRAM cells. The quad-cell structure also includes a top electrode 408 that is shared by, or common to, each of the four PRAM cells. By providing a shared top electrode 408 and shared PCM 404, the size of each of the PRAM cells can be reduced.

A via interconnect 406 is coupled to the top electrode 408. The via interconnect 406 can provide a contact for a metal wire (not shown). The via interconnect 406 provides a common contact for each of the four PRAM cells, which further reduces the size of the PRAM cells and increases the density of the PRAM quad cell.

As shown in the exemplary embodiment of FIG. 4, the PCM 404 and/or the top electrode 408 can be provided with a diamond-shaped layout. The top electrode 408 and/or the PCM 404 can include a diamond-shaped central portion having leg portions that radiate or extend from the central portion to each of the individual PRAM cells. By providing, for example, a diamond-shaped layout of the top electrode 408 and/or the PCM 404, the size of each of the PRAM cells can be reduced, and the density of the PRAM quad-cell can be increased. The ordinarily skilled artisan will recognize that the embodiments are not limited to a diamond-shaped layout and other arrangements and shapes clearly are contemplated by the embodiments.

The size of the contact window or active area 410 between the PCM film 404 and each of the heater resistors 402 is a factor in reducing the set current and the reset current of the PRAM cell. The active area 410 can be a distance (e.g., a predetermined minimum distance) from an edge of the PCM 404 such that an impact on the active area from the etching process can be prevented or reduced. Also, by reducing the size of the contact window between the PCM film 404 and each of the heater resistors 402, the disclosed embodiments can reduce the set current and the reset current of the PRAM cell.

For example, with reference again to FIGS. 4 and 5, an embodiment of a PRAM cell uses a corner of the heater resistor 402 or PCM film 404 to form a natural sub-trench overlap (e.g., a stepped portion), which forms a smaller contact window or active area 410 between the heater resistor 402 and the PCM 404.

As shown in FIG. 5, the cap film 412 is formed over the heater resistor 402 as a hardmask except for a corner portion of the heater resistor 402, which serves as the contact window (e.g., active area 410). The interlayer dielectric 414 can be etched or removed to expose a portion of the vertical surface and horizontal surface of the heater resistor 402 at each PRAM cell, A PCM film is deposited over the cap film 412, the heater resistor 402, and the ILD 414, and patterned to form the PCM 404.

The PCM 404 contacts the vertical and horizontal walls of the corner portion of the heater resistor 402, and forms a contact window having a reduced size between the heater resistor 402 and the PCM 404 compared to the size of the contact window using the conventional design rule. The disclosed embodiment reduces the size of the PCM contact window (e.g., active area 410) beyond, for example, the half pitch of lithography resolution of the conventional technology generation. That is, the disclosed embodiment is not constrained by the limitations associated with the conventional photo/etch process window, and the size of the phase change material (PCM) contact area is not limited by design rule. Hence, the embodiments can reduce the size of the contact area beyond the conventional design rule. Moreover, by reducing the size of the contact window between the PCM film 404 and each of the heater resistors 402, the disclosed embodiments provide an advantage of reducing the set current and the reset current of the PRAM cell.

As shown in FIG. 5, a metal layer is deposited over the PCM 404 and patterned to form the top electrode 408. The natural trenches or steps of the PCM 404, which are formed by depositing the PCM 404 over the cap film 412, and the corner of the heater resistor 402, result in an increased contact area between the top electrode 408 and the PCM 404, while minimizing the size of the top electrode in the horizontal direction and correspondingly increasing the density of the PRAM cells.

Figure 6:
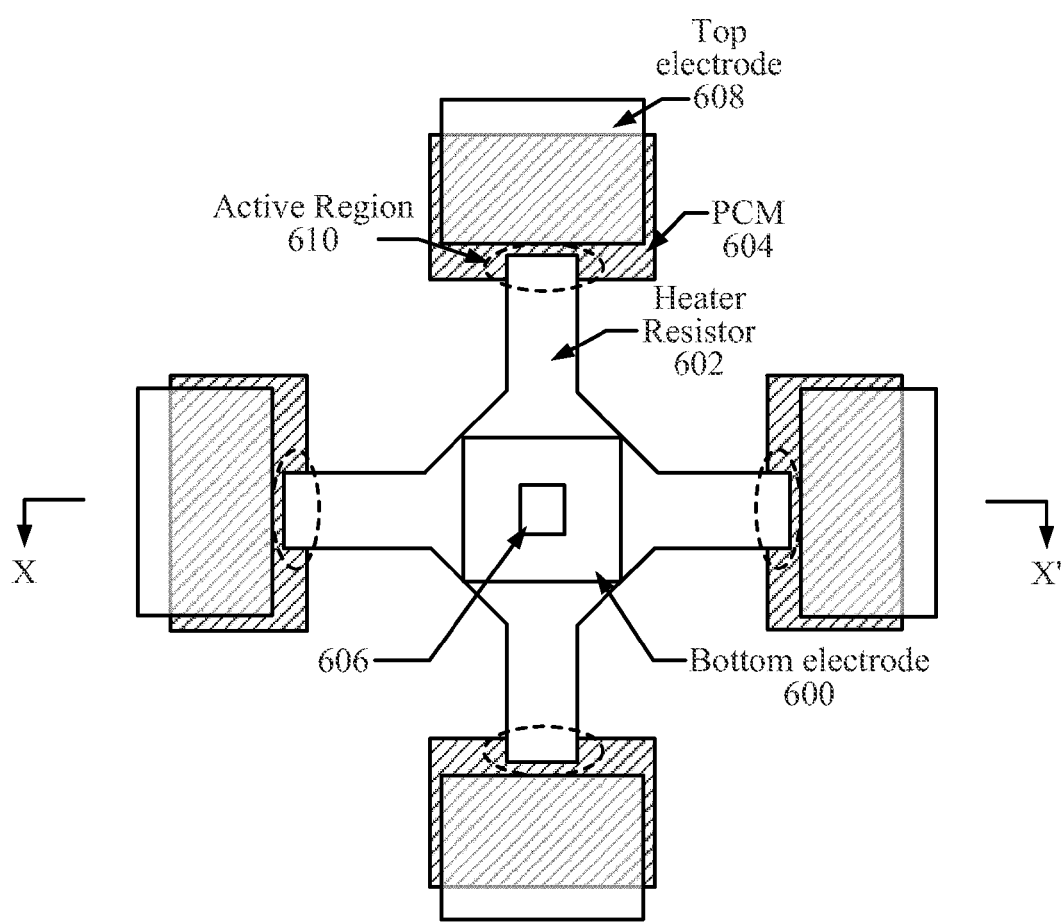
FIG. 6 is a top view of a PRAM quad-cell.
Figure 7:
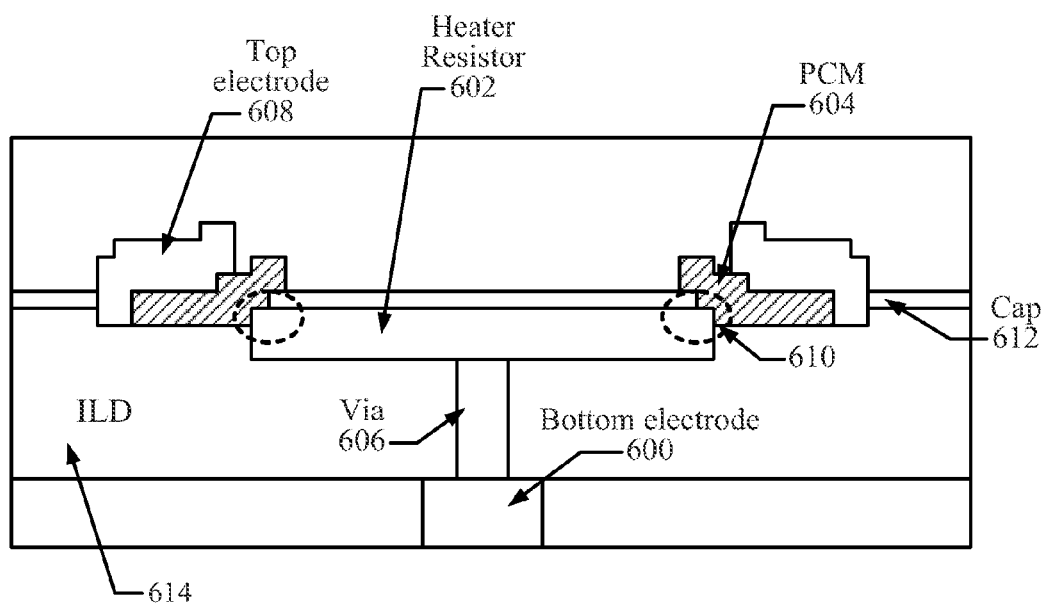
FIG. 7 is a cross-sectional view of the PRAM quad-cell illustrated in FIG. 6.

With reference to FIGS. 6 and 7, another exemplary embodiment of a novel diamond type quad-resistor cell of PRAM for providing high density PRAM integration will now be described.

As shown in FIGS. 6 and 7, the PRAM quad cell includes four PRAM cells. Each PRAM cell includes a separate or individual top electrode 608 and PCM 604. The four PRAM cells share a common bottom electrode 600 and heater resistor 602, as will be explained in greater detail below.

As shown in the exemplary embodiment of FIG. 6, each PRAM cell includes a shared or common bottom electrode 600. The bottom electrode 600 is electrically coupled to the heater resistor 602 by a via interconnect 606. The heater resistor 602 can include, for example, a diamond-shaped layout so that the heater resistor 602 is common to or shared by each of the individual PRAM cells. The heater resistor 602 includes a diamond-shaped central portion having leg portions that radiate or extend from the central portion to each of the individual PRAM cells. By providing, for example, a diamond-shaped layout of the heater resistor 602, the size of each of the PRAM cells can be reduced, and the density of the PRAM quad-cell can be increased. The ordinarily skilled artisan will recognize that the disclosed embodiments are not limited to a diamond-shaped layout and other arrangements and shapes clearly are contemplated by the embodiments.

In an embodiment, the heater resistor 602 can be formed using a higher resistivity metal to generate a Joule effect while the writing occurs. One of ordinary skill in the art will recognize that the corner of the heater resistor 602 can be formed from other materials by process. Other materials are contemplated by the present invention and the material of the PCM 604 is not limited to a compound of group VI chalcogenic elements S, Se, Te with group IV and V elements.

As shown in FIG. 7, a cap film 612 is formed over the heater resistor 602 and the inter layer dielectric (ILD) 614. The cap film 612 is patterned or removed to expose a corner portion (e.g., a vertical surface and horizontal surface) of the heater resistor 602 at each individual PRAM cell. For example, the corner of the heater resistor 602 forms a natural sub-trench or stepped portion.

The phase change material (PCM) is deposited and patterned to form the PCM 604. The PCM 604 overlaps the natural sub-trench or stepped portion of the heater resistor 602. That is, the PCM 604 contacts the vertical and horizontal surfaces of the corner portion of the heater resistor 602, and forms a contact window (e.g., active area 610) having a reduced size between the heater resistor 602 and the PCM 604 compared to the size of the contact window using the conventional design rule. The active area 610 can be a distance (e.g., a predetermined minimum distance) from an edge of the PCM 604 such that an impact on the active area from the etching process can be prevented or reduced.

The disclosed embodiments reduce the size of the PCM contact window (e.g., active area 610) beyond, for example, the half pitch of lithography resolution of the conventional technology generation. That is, the disclosed embodiments are not constrained by the limitations associated with the conventional photo/etch process window, and the size of the phase change material (PCM) contact area is not limited by design rule. Hence, the embodiments can reduce the size of the contact area beyond the conventional design rule. Moreover, by reducing the size of the contact window between the PCM film 604 and each of the heater resistors 602, the embodiments reduce the set current and the reset current of the PRAM cell.

As shown in FIG. 7, a metal layer is deposited over the PCM 604 and patterned to form the top electrode 608. Each individual PRAM cell includes a separate PCM 604 and top electrode 608. The natural trenches or steps of the PCM 604, which are formed by depositing the PCM 604 over the heater resistor 602 and cap film 612, and the corner of the heater resistor 602, result in an increased contact area between the top electrode 608 and the PCM 604, while minimizing the size of the top electrode in the horizontal direction and correspondingly increasing the density of the PRAM cells.

The size of the contact window or active area 610 between the shared or common heater resistor 602 and the PCM film 604 of each of the individual PRAM cells is a factor in reducing the set current and the reset current of the PRAM cell. For example, by reducing the size of the contact window between the shared or common heater resistor 602 and the PCM film 604 of each of the individual PRAM cells, the disclosed embodiments provide an advantage of reducing the set current and the reset current of the PRAM cell.

One of ordinary skill in the art will recognize that the disclosed embodiments are not limited to the exemplary embodiments illustrated in FIGS. 4-7, and other types of PRAM cell structures are contemplated by the embodiments.

Figure 8:
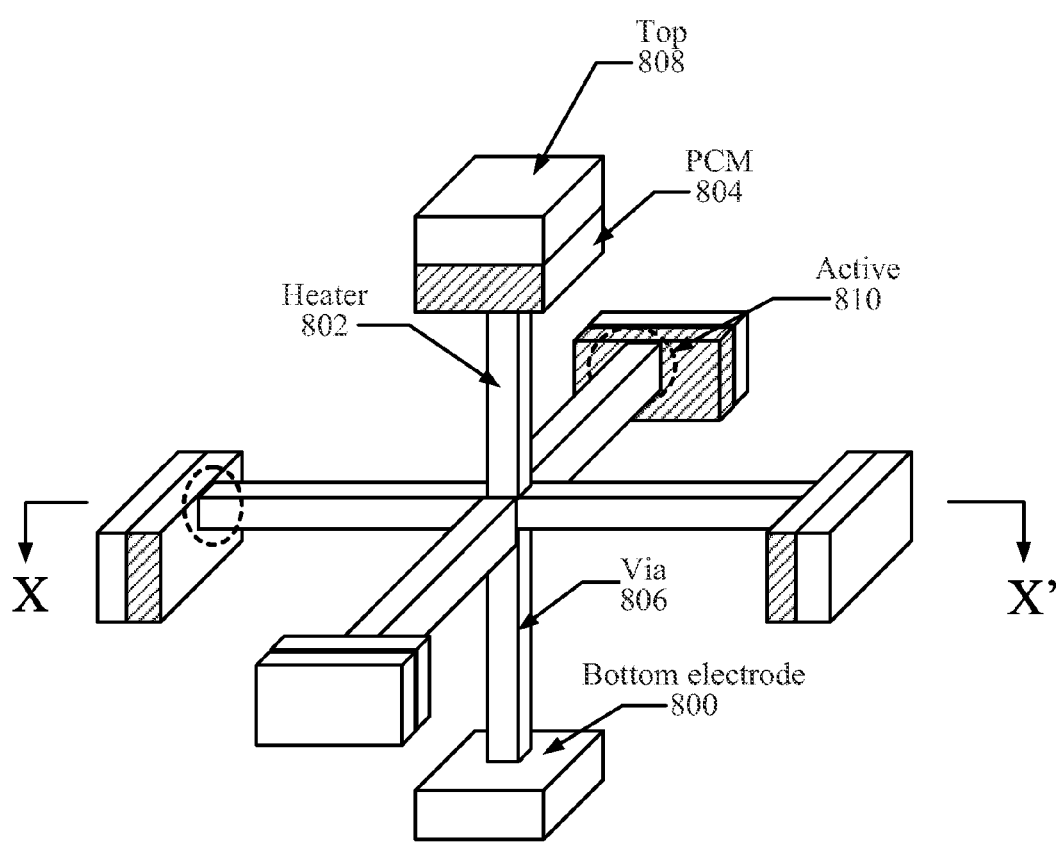
FIG. 8 is an isometric view of a three-dimensional PRAM cell.

For example, another embodiment is directed to a three-dimension (3-D) PRAM cell, as shown in FIG. 8. The 3-D PRAM cell arrangement provides an advantage of increasing the density of the cell. The 3-D PRAM cell arrangement can be formed or built, for example, by a logic backend process.

As shown in FIG. 8, an exemplary 3-D PRAM cell arrangement includes five PRAM cells. Each PRAM cell includes a separate or individual top electrode 808 and PCM 804. The five PRAM cells share a common bottom electrode 800 and a three-dimensional (3-D) heater resistor 802, as will be explained in greater detail below.

Each PRAM cell includes a shared or common bottom electrode 800. The bottom electrode 800 is electrically coupled to a shared or common heater resistor 802 by a via interconnect 806. The heater resistor 802 can include, for example, a three-dimensional (3-D) layout having five (5) leg portions that radiate or extend from a central contact portion with the via interconnect 806 to each of the five (5) individual PRAM cells so that the heater resistor 802 is common to, or shared by, each of the individual PRAM cells. In the exemplary embodiment shown in FIG. 8, the heater resistor 802 includes four (4) legs extending in a horizontal plane and a single leg extending in a vertical plane.

In an embodiment, the heater resistor 802 can be formed using a higher resistivity metal to generate a Joule effect while the writing occurs. One of ordinary skill in the art will recognize that the sidewall of the heater resistor 802 can be formed from other materials by process. Other materials are contemplated by the disclosed embodiments and the material of the PCM 804 is not limited to a compound of group VI chalcogenic elements S, Se, Te with group IV and V elements.

As shown in FIG. 8, each PRAM cell of the 3-D PRAM cell arrangement includes a phase change material (PCM) 804. The interface between the PCM 804 and the heater resistor 802 forms a contact window (e.g., active area 810). In this embodiment, the size of the contact window is limited by the size of the heater resistor 802. Accordingly, the size of the contact window is reduced compared to the size of the contact window using the conventional design rule.

By providing, for example, a 3-D layout of the heater resistor 802, the size of each of the PRAM cells can be reduced, and the density of the 3-D PRAM cell can be increased. One of ordinary skill in the art will recognize that the disclosed embodiments are not limited to this arrangement and other arrangements clearly are contemplated by the embodiments.

An exemplary method of forming a PRAM cell arrangement according to the invention will now be described with reference to FIGS. 9 and 11A-11H. One of ordinary skill will recognize that the exemplary methods can be used to form a single PRAM cell or a plurality of PRAM cells, including, for example, a quad-cell of PRAM or a 3-D PRAM cell arrangement.

Figure 9:
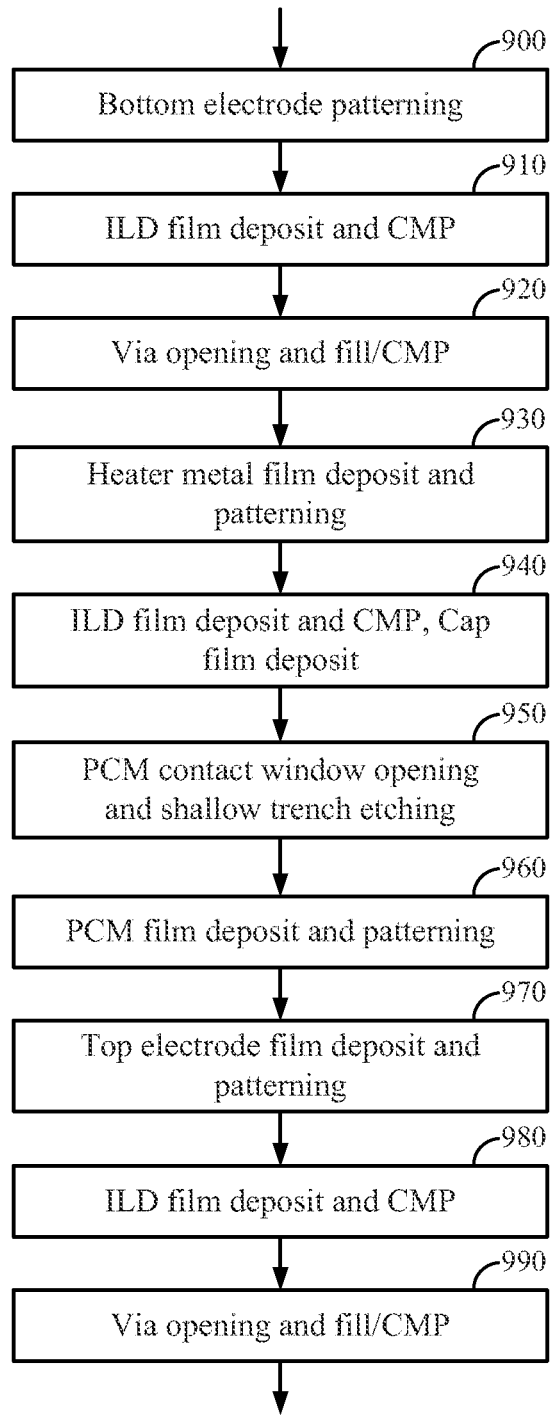
FIG. 9 is a flow diagram illustrating a method of forming a PRAM cell.
Figure 11A:
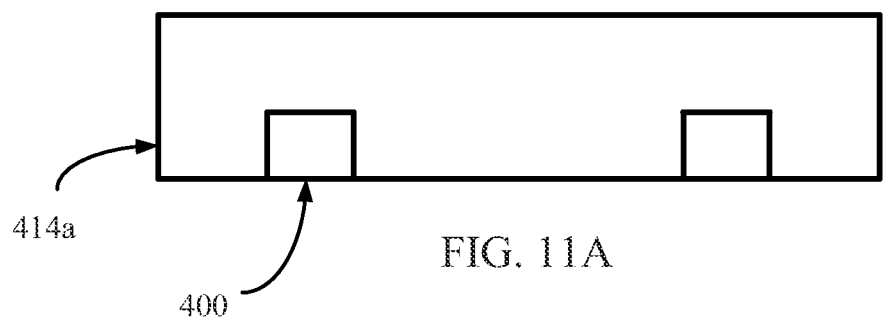
FIGS. 11A-11H show cross-sectional views of a method of forming a PRAM quad-cell during various stages of formation.
Figure 11B:
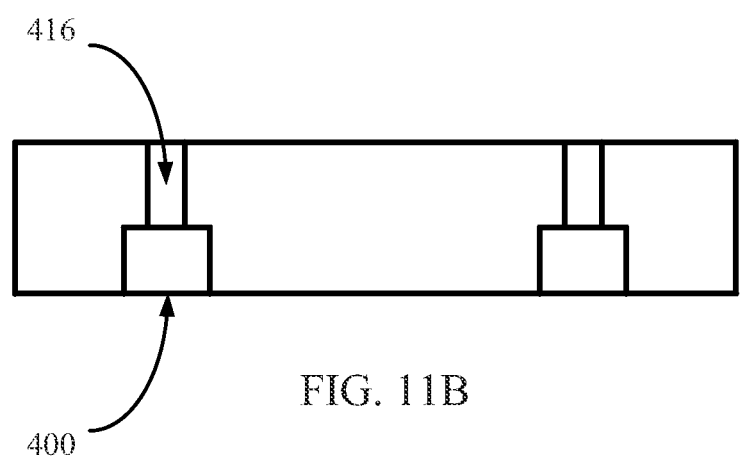

With reference to FIG. 9, and as exemplarily shown in FIG. 11A, an embodiment of the method includes patterning the bottom electrodes 400 (900). A first interlayer dielectric (ILD) film 414a is deposited over the bottom electrodes 400, and chemical mechanical polishing (CMP) is performed (910). A via opening is etched in the first ILD 414a and filled with metal to thrill a first via interconnect 416, followed by CMP of the via interconnect 416 and the first ILD 414a (920), as shown in FIG. 11B.

Figure 11C:
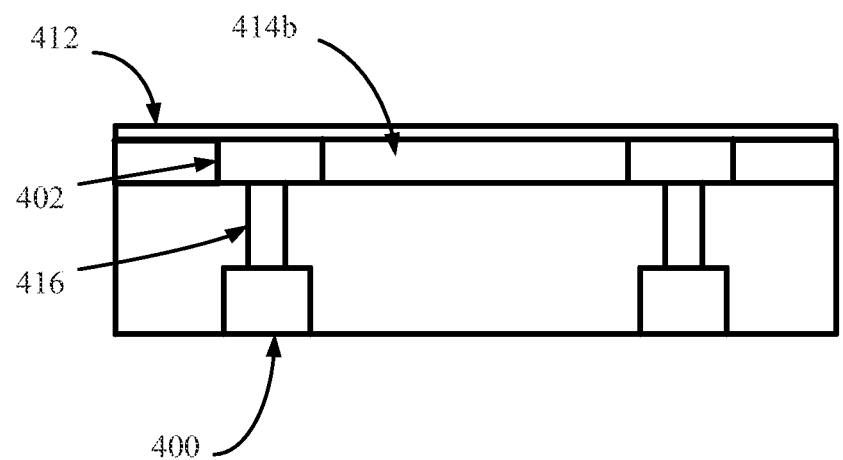

With reference to FIG. 11C, a heater metal film is deposited and patterned to form the heater resistor 402 (930). A second ILD film 414b is deposited over the heater resistor 402 and CMP is performed. The cap film 412 is deposited over the heater resistor 402 and the second ILD 414b (940).

Figure 11D:
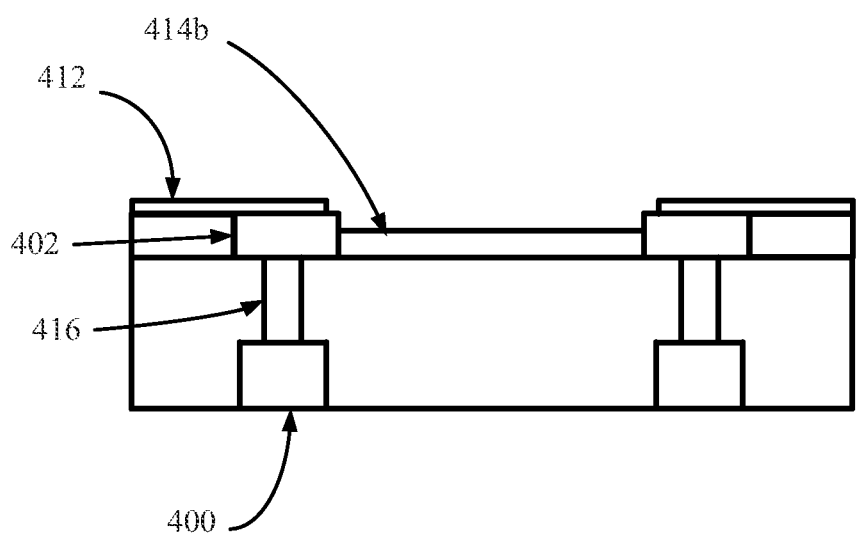
Figure 11E:
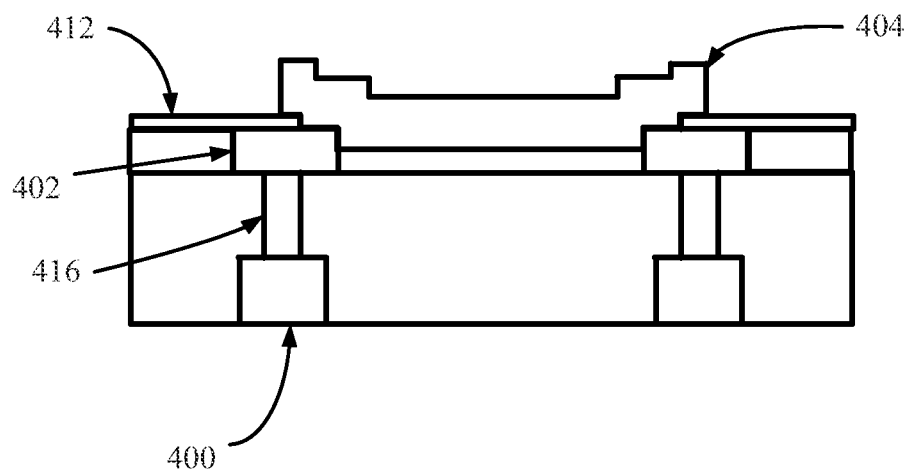

Next, a phase change material contact window opening is formed with an overetch to remove a portion of the second interlayer dielectric (ILD) 414b to expose a portion of the vertical surface and the horizontal surface of the heater resistor 402 at each PRAM cell in FIG. 11D (950). The corner of the heater resistor 402 forms a natural sub-trench overlap (e.g., a stepped portion). Then, the PCM film is deposited over the cap film 412, the heater resistor 402, and the second ILD 414b, and patterned to form the PCM 404 (960), as shown in FIG. 11E. The PCM 404 contacts the vertical and horizontal surfaces of the corner portion of the heater resistor 402, and forms a contact window having a reduced size between the heater resistor 402 and the PCM 404 compared to the size of the contact window using the conventional design rule. The embodiments reduce the size of the PCM contact window (e.g., active area 410) beyond, for example, the half pitch of lithography resolution of the conventional technology generation. That is, the disclosed embodiments are not constrained by the limitations associated with the conventional photo/etch process window, and the size of the phase change material (PCM) contact area is not limited by design rule. Hence, the embodiments can reduce the size of the contact area beyond the conventional design rule. Moreover, by reducing the size of the contact window between the PCM film 404 and each of the heater resistors 402, the embodiments provide an advantage of reducing the set current and the reset current of the PRAM cell.

Figure 11F:
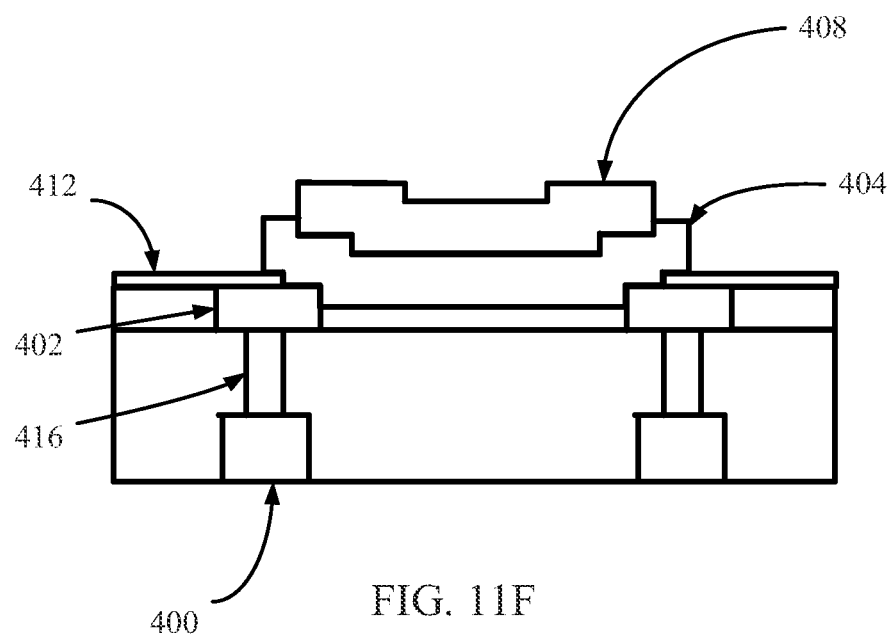

The top electrode film is deposited and patterned to form the top electrode 408 (970), as shown in FIG. 11F. The natural trenches or steps of the PCM 404, which are formed by depositing the PCM 404 over the cap film 412, and the corner of the heater resistor 402, result in an increased contact area between the top electrode 408 and the PCM 404, while minimizing the size of the top electrode in the horizontal direction and correspondingly increasing the density of the PRAM cells.

Figure 11G:
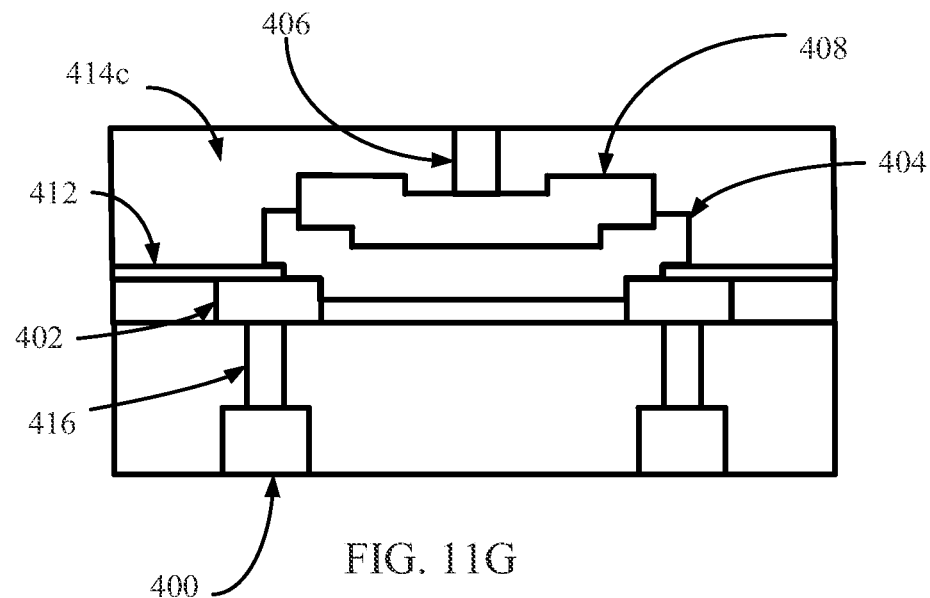
Figure 11H:
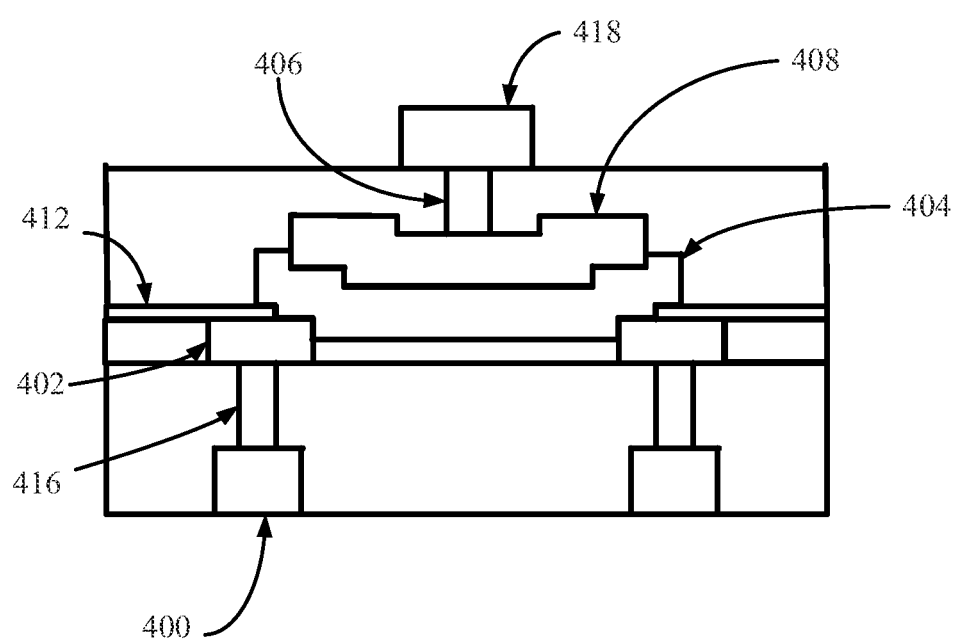

Next, the third ILD film 414c is deposited and CMP is performed (980). An opening is formed in the third ILD 414c down to the top electrode 408 and the opening is filled with metal to form the second via interconnect 406. The third ILD 414c and second via interconnect 406 are subjected to CMP (990), as shown in FIG. 11G. A top metal wire, for example, a bit line 418, can be coupled to the second via interconnect 406, as shown in FIG. 11H. The second via interconnect 406 provides a common contact to each of the cells of the PRAM quad-cell.

One of ordinary skill in the art will recognize that the exemplary method shown in FIG. 9 can be used to form a PRAM quad-cell according to the embodiments of FIGS. 11A-11H, which corresponds, for example, to the embodiment of FIGS. 4 and 5. The exemplary method shown in FIG. 9 is not limited to these disclosed embodiments, and can be used to form a PRAM quad-cell according to other embodiments, such as the embodiment of FIGS. 6 and 7.

Figure 10:
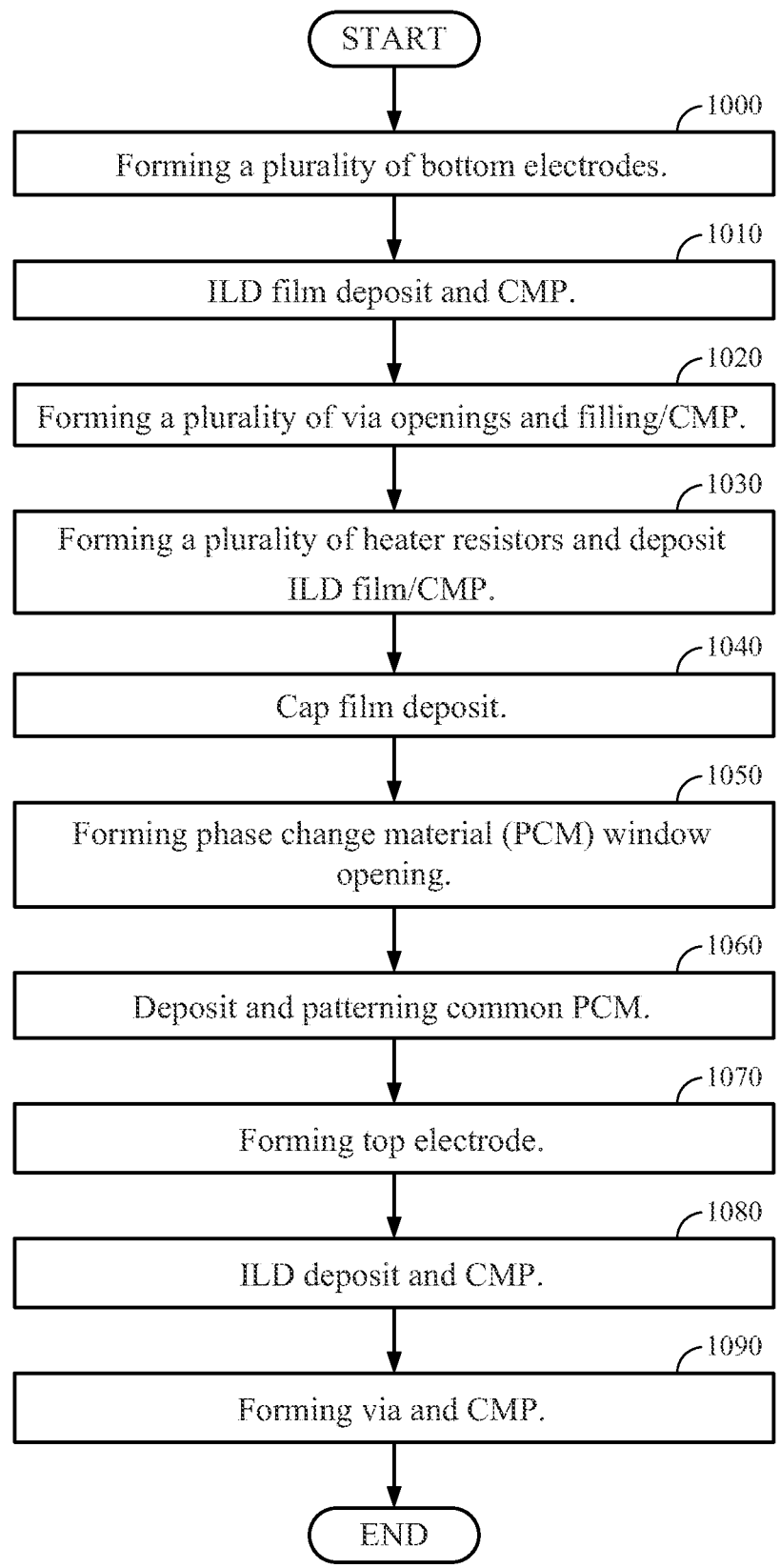
FIG. 10 is a flow diagram illustrating a method of forming a PRAM quad-cell.

With reference to FIG. 10, another method of forming a PRAM quad-cell will now be described.

An exemplary method includes forming a plurality of bottom electrodes (1000) and depositing an interlayer dielectric, followed by chemical mechanical polishing (CMP) (1010). The method includes forming a plurality of via openings and filling the opening with metal to form plurality of via interconnects, followed by CMP (1020).

Next, a plurality of heater resistors are formed and an ILD film is deposited and a CMP process is performed (1030). The exemplary method uses a corner of the heater resistor to form a natural sub-trench overlap (e.g., a stepped portion), which forms a smaller contact window or active area between the heater resistor and the PCM. For example, the cap film is formed over each heater resistor except for a corner portion of the heater resistor, which serves as the contact window (e.g., active area). The interlayer dielectric can be etched or removed to expose a portion of the vertical surface and horizontal surface of the heater resistor at each PRAM cell. A PCM film is deposited over the cap film, the heater resistor, and the ILD, and patterned to form the PCM.

The PCM contacts the vertical and horizontal walls of the corner portion of the heater resistor, and forms a contact window having a reduced size between the heater resistor and the PCM compared to the size of the contact window using the conventional design rule. The disclosed embodiment reduces the size of the PCM contact window e.g., active area) beyond, for example, the half pitch of lithography resolution of the conventional technology generation. That is, the embodiments are not constrained by the limitations associated with the conventional photo/etch process window, and the size of the phase change material (PCM) contact area is not limited by design rule. Hence, the embodiments can reduce the size of the contact area beyond the conventional design rule. Moreover, by reducing the size of the contact window between the PCM film and each of the heater resistors, the embodiments provide an advantage of reducing the set current and the reset current of the PRAM cell.

With reference again to FIG. 10, a cap film is deposited (1040). Next, a phase change material (PCM) window opening is formed by a photo and etching process (1050) and the phase change material is deposited and patterned to form a common PCM for each of the plurality of heater resistors (1060). Next, a top electrode is formed over the PCM (1070). A step of ILD deposit and a CMP process is performed (1080). Finally, a second (common) via interconnect is formed in the ILD and coupled to the top electrode, followed by a CMP process (1090). A top metal wire bit line) 418 is coupled to the second (common) via interconnect.

Figure 12:
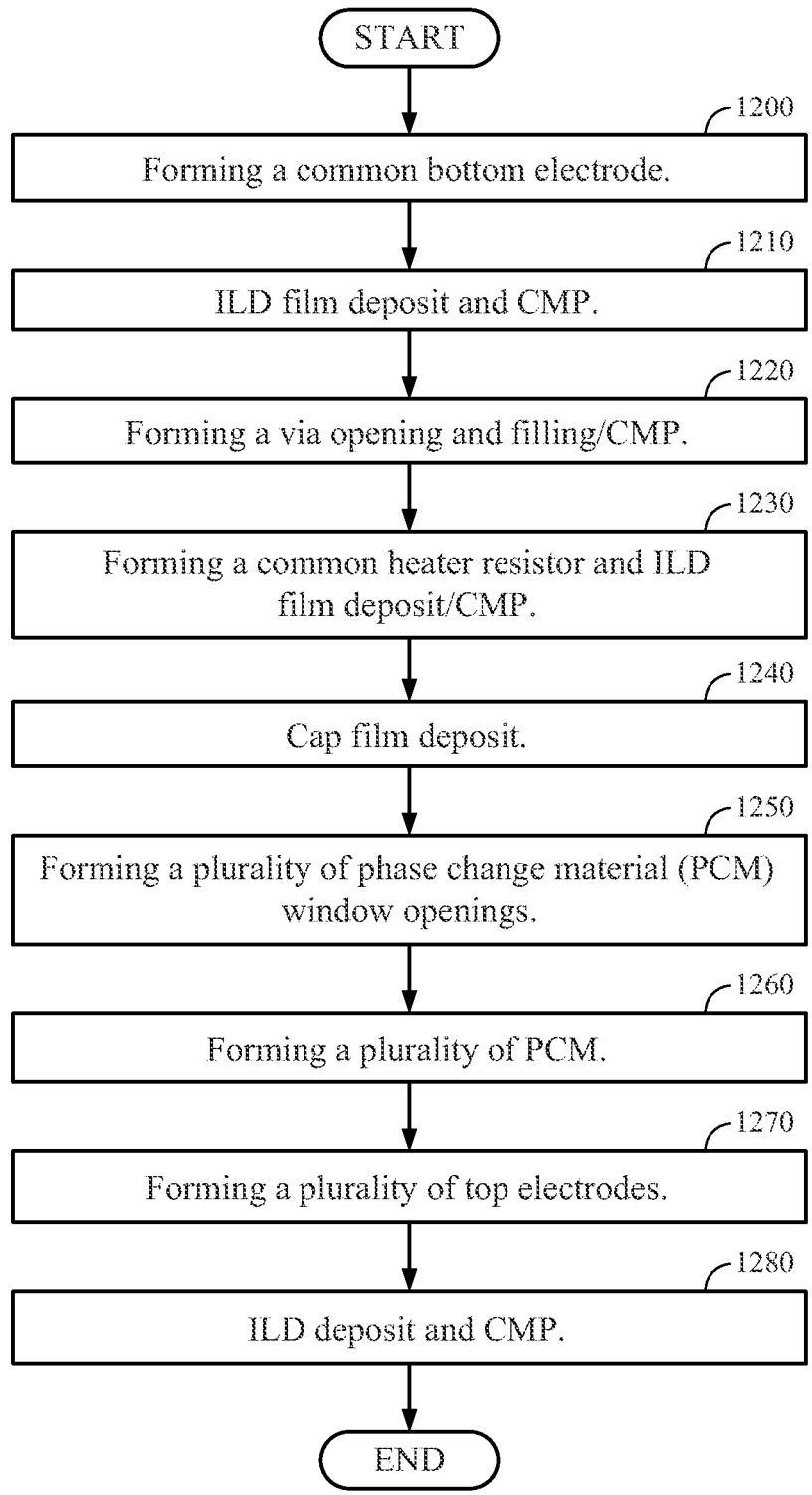
FIG. 12 is a flow diagram illustrating a method of forming a PRAM quad-cell.

With reference to FIG. 12, another method of forming a PRAM quad-cell will now be described.

A method includes forming a bottom electrode (1200) and depositing an interlayer dielectric (ILD), followed by a chemical mechanical polishing (CMP) process (1210). The method includes forming a via opening and filling the opening with metal to form a via interconnect, followed by a CMP process (1020). Next, a common or shared heater resistor is formed with a cap film. An ILD film is deposited and a CMP process is performed (1230).

Next, a cap film is deposited over the heater resistor and the ILD film (1210). A plurality of phase change material (PCM) window openings are formed (1250) and the phase change material is deposited to form a PCM for each of the plurality of PRAM cells (1260). The PCM contacts the vertical and horizontal surfaces of the corner portion of the heater resistor, and forms a contact window having a reduced size between the heater resistor and the PCM compared to the size of the contact window using the conventional design rule. The disclosed embodiment reduces the size of the PCM contact window (e.g., active area) beyond, for example, the half pitch of lithography resolution of the conventional technology generation. That is, the embodiments are not constrained by the limitations associated with the conventional photo/etch process window, and the size of the phase change material (PCM) contact area is not limited by design rule. Hence, the embodiments can reduce the size of the contact area beyond the conventional design rule. Moreover, by reducing the size of the contact window between the PCM film and each of the heater resistors, the embodiments provide an advantage of reducing the set current and the reset current of the PRAM cell.

Next, a separate or individual top electrode is formed over each of the plurality of PCM films (1270). The natural trenches or steps of the PCM, which are formed by depositing the PCM over the cap film, and the corner of the heater resistor, result in an increased contact area between the top electrode and the PCM, while minimizing the size of the top electrode in the horizontal direction and correspondingly increasing the density of the PRAM cells. Next, an ILD layer is deposited and a CMP process is performed (1280).

It will be appreciated that the PRAM cells and PRAM cell arrangements, as illustrated for example in FIGS. 4, 6, and 8, may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Those of skill in the art will appreciate that the disclosed embodiments are not limited to illustrated exemplary structures or methods, and any means for performing the functionality described herein are included in the embodiments.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A phase-change random access memory (PRAM) arrangement comprising:
    a common heater resistor having a plurality of first leg portions extending in a first plane and at least one second leg portion extending in a second plane; and
    a phase change material (PCM) film over an end of each of the plurality of first leg portions and the at least one second leg portion of the heater resistor,
    wherein the interface between the phase change material (PCM) film and the end of each of the plurality of first leg portions and the at least one second leg portion of the heater resistor forms active regions.

2. The PRAM arrangement according to claim 1, further comprising:
    a common bottom electrode;
    a common via interconnect on the bottom electrode; and
    a top electrode over the phase change material (PCM) film,
    wherein the common heater resistor is on the via interconnect.

3. The PRAM arrangement of claim 1 integrated in at least one semiconductor die.

4. The PRAM arrangement of claim 1, further comprising an electronic device, selected from the group consisting of a set top box, music player, video player, entertainment unit, navigation device, communications device, personal digital assistant (PDA), fixed location data unit, and a computer, into which the PRAM arrangement is integrated.

5. A method of forming a three-dimensional phase-change random access memory (PRAM) cell arrangement, the method comprising:
    forming a common heater resistor, wherein the heater resistor includes a plurality of first leg portions extending in a first plane and at least one second leg portion extending in a second plane; and
    forming a phase change material (PCM) film over an end of each of the plurality of first leg portions and the at least one second leg portion of the heater resistor to form active regions.

6. The method according to claim 5, further comprising:
    forming a common bottom electrode;
    forming a common via interconnect on the bottom electrode; and
    forming a top electrode over the phase change material (PCM) film,
    wherein the common heater resistor is formed on the via interconnect.

7. The method according to claim 5, wherein the three-dimensional PRAM cell arrangement is applied in an electronic device, selected from the group consisting of a set top box, music player, video player, entertainment unit, navigation device, communications device, personal digital assistant (PDA), fixed location data unit, and a computer, into which the three-dimensional PRAM cell arrangement is integrated.

* * * * *